United States Patent
Kitamura et al.

(10) Patent No.: US 11,043,314 B2
(45) Date of Patent: Jun. 22, 2021

(54) CONDUCTIVE SHEET, METHOD FOR MANUFACTURING THE SAME, CARBON COMPOSITE PASTE, CARBON COMPOSITE FILLER, CONDUCTIVE RESIN MATERIAL AND CONDUCTIVE RUBBER MATERIAL

(71) Applicants: UNIVERSITY PUBLIC CORPORATION OSAKA, Osaka (JP); SEIWA ELECTRIC MFG. CO., LTD., Joyo (JP)

(72) Inventors: Shinichi Kitamura, Sakai (JP); Kenji Matsuno, Joyo (JP); Yukihiro Hijiri, Joyo (JP); Takeshi Horiguchi, Joyo (JP)

(73) Assignees: UNIVERSITY PUBLIC CORPORATION OSAKA, Osaka (JP); SEIWA ELECTRIC MFG. CO., LTD., Joyo (JP)

(*) Notice: Subject to any disclaimer, the term of this patent is extended or adjusted under 35 U.S.C. 154(b) by 311 days.

(21) Appl. No.: 15/032,629

(22) PCT Filed: Oct. 30, 2014

(86) PCT No.: PCT/JP2014/078948
§ 371 (c)(1),
(2) Date: Apr. 28, 2016

(87) PCT Pub. No.: WO2015/064708
PCT Pub. Date: May 7, 2015

(65) Prior Publication Data
US 2016/0268017 A1 Sep. 15, 2016

(30) Foreign Application Priority Data
Nov. 1, 2013 (JP) .............................. JP2013-228041

(51) Int. Cl.
*H01B 1/24* (2006.01)
*H05K 9/00* (2006.01)

(52) U.S. Cl.
CPC ............... *H01B 1/24* (2013.01); *H05K 9/009* (2013.01); *H05K 9/0079* (2013.01); *H05K 9/0083* (2013.01)

(58) Field of Classification Search
CPC ...... H01B 1/24; H05K 9/0079; H05K 9/0083; H05K 9/009
See application file for complete search history.

(56) References Cited

U.S. PATENT DOCUMENTS

| 4,608,244 | A | * | 8/1986 | Sugihara | .................. C09C 1/54 423/449.1 |
| 6,528,572 | B1 | * | 3/2003 | Patel | ........................ C08K 3/04 524/495 |

(Continued)

FOREIGN PATENT DOCUMENTS

| CN | 1802712 A | 7/2006 |
| CN | 101240091 A | 8/2008 |

(Continued)

OTHER PUBLICATIONS

DENKA elastomers and performance plastics (DENAK Black, http://www.denka.co.jp/eng/scm/product/scm/detail_003360.html) (Year: 2004).*

(Continued)

*Primary Examiner* — Alicia J Sawdon
(74) *Attorney, Agent, or Firm* — Metrolex IP Law Group, PLLC

(57) ABSTRACT

A conductive sheet capable of improving conductivity by suppressing reaggregation of carbon nanotubes, and a manufacturing method thereof are provided. Also, carbon composite paste and carbon composite filler are provided. The conductive sheet is characterized in that carbon nanotubes (Continued)

and carbon black as conductive materials are dispersed in a resin material. Carbon composite filler, which is composed of the carbon nanotubes in an amount of 10-30 wt. % and the carbon black in an amount of 90-70 wt. %, is dispersed uniformly in the resin material. The conductive sheet is composed of the carbon composite filler in an amount of 10-50 wt. % and the resin material in an amount of 90-50 wt. %, whose surface resistance value is 1-10 Ω/sq.

21 Claims, 5 Drawing Sheets

(56) References Cited

U.S. PATENT DOCUMENTS

| | | | |
|---|---|---|---|
| 9,005,481 B2 | 4/2015 | Yoshida et al. | |
| 2004/0016912 A1* | 1/2004 | Bandyopadhyay | C08K 3/04 |
| | | | 252/500 |
| 2004/0071949 A1* | 4/2004 | Glatkowski | B82Y 10/00 |
| | | | 428/313.3 |
| 2006/0108567 A1 | 5/2006 | Charati et al. | |
| 2007/0000642 A1* | 1/2007 | Yamazaki | H01L 23/3677 |
| | | | 165/80.3 |
| 2009/0148573 A1* | 6/2009 | Kitamura | C08B 1/003 |
| | | | 426/323 |
| 2010/0078194 A1* | 4/2010 | Bhatt | B82Y 30/00 |
| | | | 174/110 SR |
| 2010/0224836 A1 | 9/2010 | Kitamura et al. | |
| 2011/0024675 A1* | 2/2011 | Endo | C09D 183/04 |
| | | | 252/78.3 |
| 2011/0245388 A1* | 10/2011 | Monden | C08K 5/42 |
| | | | 524/161 |
| 2014/0202745 A1* | 7/2014 | Kobayashi | H05K 1/028 |
| | | | 174/254 |

FOREIGN PATENT DOCUMENTS

| | | | | |
|---|---|---|---|---|
| CN | 101415785 A | | 4/2009 | |
| JP | 2004184513 A | * | 7/2004 | |
| JP | 2006-507380 A | | 3/2006 | |
| JP | 2007-215542 A | | 8/2007 | |
| JP | 2007-217684 A | | 8/2007 | |
| JP | 2009-518463 A | | 5/2009 | |
| JP | 2011-146284 A | | 7/2011 | |
| WO | WO-2013146262 A1 | * | 10/2013 | H05K 1/028 |

OTHER PUBLICATIONS

Study on the Preparation and Properties of Carbon Nanotube/Carbon Black Epoxy Resin System by Yang, et al., pp. 94-97 and p. 108, vol. 41 No. 17, Sep. 2013, Guangzhou Chemical Industry.

* cited by examiner

FIG.3

| CNT(wt.%) | CB(wt.%) | Surface resistance value(Ω/sq) |
|---|---|---|
| 0 | 100 | 62 |
| 1 | 99 | 40 |
| 5 | 95 | 22 |
| 10 | 90 | 10 |
| 15 | 85 | 8 |
| 20 | 80 | 6.5 |
| 25 | 75 | 3.9 |
| 30 | 70 | 2.1 |
| 40 | 60 | 1.8 |
| 50 | 50 | 1 |

CONDUCTIVE SHEET, METHOD FOR MANUFACTURING THE SAME, CARBON COMPOSITE PASTE, CARBON COMPOSITE FILLER, CONDUCTIVE RESIN MATERIAL AND CONDUCTIVE RUBBER MATERIAL

TECHNICAL FIELD

The present invention relates to a conductive sheet, a method for manufacturing the same, carbon composite paste, carbon composite filler, a conductive resin material and a conductive rubber material. The present invention specifically relates to a technique for improving conductivity by suppressing reaggregation of carbon nanotubes.

BACKGROUND ART

Conventionally, conductive materials such as metal powder, metal fiber, carbon black and carbon nanotubes are dispersed in a resin material so as to give conductivity to the resin material. For example, a resin product such as a conductive sheet is manufactured by adding carbon nanotubes, carbon black and the like directly to a resin material and then kneading and forming the mixture.

However, since the carbon nanotubes have a strong auto-aggregation property, it is difficult to unfasten the bundles, thus it is difficult to disperse the carbon nanotubes uniformly in the resin material. Furthermore, sometimes the carbon nanotubes reaggregate in the step of kneading the carbon nanotubes with the resin material, which causes deterioration in conductivity.

On the other hand, out of the carbon blacks, acetylene black can be dispersed uniformly in the resin material. Thus, it is possible to improve conductivity by increasing concentration of the acetylene black. However, by this method, the surface resistance value can only be reduced to a certain extent (e.g., approximately to 50 Ω/sq). Thus, even when the concentration of the carbon black is increased, it is not possible to further improve the conductivity. Also, the carbon black that is excessively added causes deterioration in strength of the resin product (e.g., deterioration in tensile strength).

As described above, conventionally, when the carbon nanotubes are used as the conductive material, there is a problem of deterioration in the conductivity caused by the reaggregation of the carbon nanotubes, and when the carbon black is used as the conductive material, there is a problem that the improvement of the conductivity is limited.

Examples of techniques for suppressing the reaggregation of the carbon nanotubes include a technique proposed by Patent Document 1. Patent Document 1 discloses a method for manufacturing a composite positive electrode active material being a composite of a positive electrode active material and carbon nanotubes. It proposes to obtain a composite positive electrode active material that has excellent output characteristics, by forming a composite in which the reaggregation of the carbon nanotubes is suppressed and dispersibility between the positive electrode active material and the carbon nanotubes is enhanced.

PRIOR ART DOCUMENT

Patent Document

[Patent Document 1] JP 2011-146284 A

SUMMARY OF INVENTION

Problem to be Solved by Invention

The present invention was made in consideration of the above circumstances. An object of the present invention is to provide a conductive sheet capable of suppressing reaggregation of carbon nanotubes and improving conductivity, a method for manufacturing the same, carbon composite paste, carbon composite filler, a conductive resin material and a conductive rubber material.

Means for Solving Problem

In order to resolve the above problems, the present invention provides the following configuration. That is, in the present invention, a conductive sheet includes carbon nanotubes and carbon black as conductive materials, which are dispersed in a resin material. Carbon composite filler, which is composed of the carbon nanotubes in an amount of 10 to 30 wt. % and the carbon black in an amount of 90 to 70 wt. %, is dispersed uniformly in the resin material. The conductive sheet is composed of the carbon composite filler in an amount of 10 to 50 wt. % and the resin material in an amount of 90 to 50 wt. %. A surface resistance value of the conductive sheet is from 1 to 10 Ω/sq. More specifically, the conductive sheet of the present invention preferably has a thickness of 1 mm or less. The expression here "dispersed uniformly" means that the carbon nanotubes are dispersed, with almost all (not less than 90%) of the bundles of the carbon nanotubes being unfastened.

With the present invention, since the carbon composite filler, in which the carbon nanotubes and the carbon black are dispersed, is dispersed uniformly in the resin material, it is possible to suppress reaggregation of the carbon nanotubes. Specifically, since the carbon nanotubes enter into the carbon black dispersed in the resin material, the reaggregation of the carbon nanotubes is suppressed. Then, the carbon nanotubes that enter into the carbon black form conductive paths. Therefore, it is possible to provide the conductive sheet excellent in conductivity. Also, the concentration of the carbon black can be reduced so that it is equal to or lower than the concentration in the case in which only the carbon black is used as the conductive material. Thus, it is possible to suppress deterioration in strength of the conductive sheet, which is caused by the carbon black excessively added.

In the conductive sheet of the present invention, the carbon composite filler is preferably prepared by the steps of: preparing a mixture by mixing a dispersion liquid in which the carbon nanotubes are dispersed in a dispersing agent and a dispersion liquid in which the carbon black is dispersed in a solvent; and drying a carbon composite paste obtained by separating the dispersing agent from the mixture.

With the present invention, since water and the solvent have been removed from the dried carbon composite filler, when preparing the conductive sheet using the dried carbon composite filler, it is possible to prevent curing inhibition of the resin material that is caused by the water and the solvent entering into the resin material.

In the conductive sheet of the present invention, it is preferable that: the carbon nanotubes are multi-walled carbon nanotubes with an aspect ratio of from 130 to 170; the carbon black is acetylene black; the dispersing agent is a water-soluble xylan solution; the solvent is acetone; and the resin material is a silicone resin.

With the present invention, since the multi-walled carbon nanotubes with the aspect ratio of from 130 to 170 are used as the carbon nanotubes, it is possible to easily form the conductive paths by the carbon nanotubes in the resin material. Thus, the conductivity of the conductive sheet can be improved. Also, since the water-soluble xylan solution is used as the dispersing agent, auto-aggregation of the carbon nanotubes can be effectively prevented when preparing the carbon nanotube dispersion liquid. Thus, the carbon nanotubes can be dispersed uniformly in the water-soluble xylan solution. Furthermore, since the silicone resin is used as the resin material, it is possible to provide the conductive sheet excellent in weatherability and heat resistivity. Note that an oil-based urethane resin or an aqueous urethane resin may be used as the resin material in place of the silicone resin.

In the conductive sheet of the present invention, it is preferable that: the electromagnetic shieldability measured by KEC method is 35 dB or more at a frequency of 100 MHz; the electromagnetic shieldability measured by a coaxial tube method is at least 20 dB in a frequency band of 1 to 3 GHz (more preferably, 1 to 6 GHz); the durometer hardness is from A40 to A75; at least one of a platinum compound, iron oxide, titanium oxide, cerium oxide, calcium oxide, phosphoric acid, cerium hydroxide, calcium hydroxide and silicon oxide is added to the conductive sheet as a flame retardant; and the flame retardancy is V-1 or more under UL 94 test conditions. As the platinum compound, it is possible to use a publicly known platinum compound, in particular: a platinum simple substance; chloroplatinic acid; an alcohol compound, an aldehyde compound, an ether compound of the chloroplatinic acid; and complexes of the chloroplatinic acid with various olefins.

Also, the present invention provides a method for manufacturing a conductive sheet including carbon nanotubes and carbon black, which are dispersed in a resin material, as conductive materials. The method includes the steps of: mixing a dispersion liquid in which the carbon nanotubes are dispersed in a dispersing agent and a dispersion liquid in which the carbon black is dispersed in a solvent so as to prepare a mixture; separating the dispersing agent from the mixture so as to prepare carbon composite paste; drying the carbon composite paste so as to prepare carbon composite filler; and forming the conductive sheet by thermoforming after kneading the carbon composite filler with the resin material.

With the present invention, since the mixture is prepared by mixing the carbon nanotube dispersion liquid and the carbon black dispersion liquid both previously prepared, it is possible to prepare the carbon composite paste, the carbon composite filler and the conductive sheet in which the carbon nanotubes and the carbon black are dispersed uniformly. Thus, the carbon nanotubes enter into the carbon black dispersed in the resin material, which suppresses reaggregation of the carbon nanotubes. Then, the carbon nanotubes that enter into the carbon black form conductive paths. Therefore, with the present invention, it is possible to provide the conductive sheet excellent in conductivity.

In the method for manufacturing the conductive sheet of the present invention, it is preferable to prepare the mixture containing the carbon nanotubes and the carbon black at a ratio of 10 to 30 wt. %:90 to 70 wt. % in the mixing step.

With the present invention, the concentration of the carbon black can be reduced so that it is equal to or lower than the concentration in the case in which only the carbon black is used as the conductive material. Thus, it is possible to suppress deterioration in strength of the conductive sheet, which is caused by the carbon black excessively added.

In the method for manufacturing the conductive sheet of the present invention, it is preferable that: the carbon nanotubes are multi-walled carbon nanotubes with an aspect ratio of from 130 to 170; the carbon black is acetylene black; the dispersing agent is a water-soluble xylan solution; the solvent is acetone; and the resin material is a silicone resin.

With the present invention, since the multi-walled carbon nanotubes with the aspect ratio of from 130 to 170 are used as the carbon nanotubes, it is possible to easily form the conductive paths by the carbon nanotubes in the resin material. Thus, the conductivity of the conductive sheet can be improved. Also, since the water-soluble xylan solution is used as the dispersing agent, auto-aggregation of the carbon nanotubes can be effectively prevented when preparing the carbon nanotube dispersion liquid. Thus, the carbon nanotubes can be dispersed uniformly in the water-soluble xylan solution. Furthermore, since the silicone resin is used as the resin material, it is possible to provide the conductive sheet excellent in weatherability and heat resistivity. Note that an oil-based urethane resin or an aqueous urethane resin may be used as the resin material in place of the silicone resin.

In the method for manufacturing the conductive sheet of the present invention, it is preferable that the mixture is filtered in the separating step so as to separate the water-soluble xylan solution and the acetone from the mixture.

With the present invention, since the dispersing agent (water-soluble xylan solution), which may inhibit the conductivity, is separated from the mixture by filtration. Thus, it is possible to prevent the dispersing agent from remaining in the conductive sheet. Therefore, the conductivity of the conductive sheet can be improved.

In the method for manufacturing the conductive sheet of the present invention, it is preferable that, when the mixture is filtered, a remaining material is rinsed with water and either of ethanol or isopropyl alcohol.

With the present invention, since the remaining material is rinsed when filtrating, the dispersing agent (water-soluble xylan solution) and the solvent (acetone and the like) can be effectively removed. Thus, it is possible to prevent the dispersing agent from remaining in the conductive sheet, which results in improved conductivity of the conductive sheet.

In the method for manufacturing the conductive sheet of the present invention, it is preferable that, in the drying step, the carbon composite paste is left at a room temperature for 12 hours or more, and then dried at a temperature of 130° C. or more for 3 hours or more.

With the present invention, since the drying is performed at the temperature of 130° C. or more for 3 hours or more, the water and the solvent (acetone and the like) are removed from the carbon composite paste. Thus, when preparing the conductive sheet in the forming step, it is possible to suppress curing inhibition of the resin material.

In the method for manufacturing the conductive sheet of the present invention, when kneading the carbon composite filler with the resin material in the forming step, a curing agent, a heat resistant agent and a flame retardant are preferably added.

With the present invention, when preparing the conductive sheet, it is possible to provide the conductive sheet excellent in heat resistivity and flame retardancy.

Also, the present invention provides carbon composite paste including carbon nanotubes and carbon black as conductive materials, which is prepared by the steps of; preparing a mixture containing the carbon nanotubes and the carbon black at a ratio of 10 to 30 wt. %:90 to 70 wt. %, by mixing the carbon nanotubes dispersed in a water-soluble xylan solution and the carbon black dispersed in acetone; and separating the water-soluble xylan solution and the acetone from the mixture by filtration.

With the present invention, since the mixture is prepared by mixing the carbon nanotube dispersion liquid and the carbon black dispersion liquid both previously prepared, it is possible to easily obtain the carbon composite paste in which the carbon nanotubes and the carbon black are dispersed uniformly. Since the carbon composite paste of the present invention can suppress scattering of the carbon, it is easy to treat and can be suitably used as an experimental material and the like.

Also, the carbon composite filler of the present invention is obtained by drying the carbon composite paste of the present invention. For example, the carbon composite filler can be prepared by leaving the carbon composite paste at a room temperature for 12 hours or more, and then drying the carbon composite paste at a temperature of 130° C. or more for 3 hours or more.

With the present invention, since the mixture is prepared by mixing the carbon nanotube dispersion liquid and the carbon black dispersion liquid both previously prepared, it is possible to easily obtain the carbon composite filler in which the carbon nanotubes and the carbon black are dispersed uniformly. Since the drying is performed at the temperature of 130° C. or more for 3 hours or more, the water and the solvent (acetone and the like) are removed, thus, it is possible to suppress curing inhibition of the resin material in the resin product such as the conductive sheet. The carbon composite filler of the present invention can be suitably used as an electrode material for a battery, a transparent film material, a conductive rubber material and the like.

The conductive resin material of the present invention includes: 10 to 50 wt. % carbon composite filler obtained by drying the carbon composite paste of the present invention; and 90 to 50 wt. % resin material. Also, the conductive rubber material of the present invention includes: 10 to 50 wt. % carbon composite filler obtained by drying the carbon composite paste of the present invention; and 90 to 50 wt. % rubber material.

With the present invention, since the mixture is prepared by mixing the carbon nanotube dispersion liquid and the carbon black dispersion liquid both previously prepared, it is possible to easily obtain the conductive resin material and the conductive rubber material in which the carbon nanotubes and the carbon black are dispersed uniformly.

Effects of Invention

In the conductive sheet of the present invention, the carbon composite filler, in which the carbon nanotubes and the carbon black are dispersed, is dispersed uniformly in the resin material. Thus, it is possible to suppress reaggregation of the carbon nanotubes.

Specifically, since the carbon nanotubes enter into the carbon black dispersed in the resin material, the reaggregation of the carbon nanotubes is suppressed. Then, the carbon nanotubes that enter into the carbon black form conductive paths. Therefore, it is possible to provide the conductive sheet excellent in conductivity. Also, the concentration of the carbon black can be reduced so that it is equal to or lower than the concentration in the case in which only the carbon black is used as the conductive material. Thus, it is possible to suppress deterioration in strength of the conductive sheet, which is caused by the carbon black excessively added.

In the method for manufacturing the conductive sheet of the present invention, the mixture is prepared by mixing the carbon nanotube dispersion liquid and the carbon black dispersion liquid both previously prepared. Thus, it is possible to prepare the carbon composite paste, the carbon composite filler and the conductive sheet, in which the carbon nanotubes and the carbon black are dispersed uniformly. Therefore, as the carbon nanotubes enter into the carbon black dispersed in the resin material, it is possible to suppress the reaggregation of the carbon nanotubes. Then, the carbon nanotubes that enter into the carbon black form the conductive paths. Therefore, the method for manufacturing the conductive sheet according to the present invention can provide the conductive sheet excellent in conductivity.

In the carbon composite paste and the carbon composite filler of the present invention, the mixture is prepared by mixing the carbon nanotube dispersion liquid and the carbon black dispersion liquid both previously prepared. Thus, it is possible to easily obtain the carbon composite paste and the carbon composite filler in which the carbon nanotubes and the carbon black are dispersed uniformly.

In the conductive resin material and the conductive rubber material of the present invention, the mixture is prepared by mixing the carbon nanotube dispersion liquid and the carbon black dispersion liquid both previously prepared. Thus, it is possible to easily obtain the conductive resin material and the conductive rubber material in which the carbon nanotubes and the carbon black are dispersed uniformly.

BRIEF DESCRIPTION OF DRAWINGS

FIG. 3 is a table showing an example of measurement results of surface resistance values of respective conductive sheets.

MODES FOR CARRYING OUT INVENTION

Method for Manufacturing Conductive Sheet

First, description will be given on a method for manufacturing a conductive sheet according to the present invention.

Figure 1:
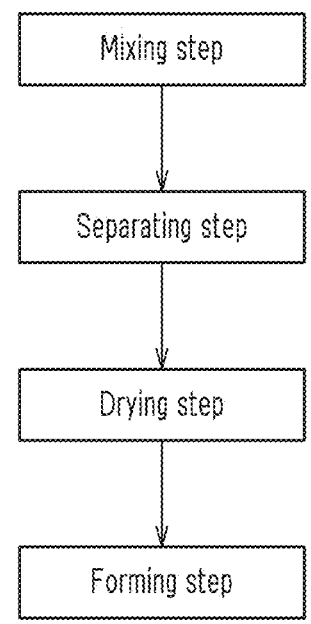
FIG. 1 is a flowchart showing an example of a method for manufacturing a conductive sheet according to the present invention.

FIG. 1 is a flowchart showing an example of a method for manufacturing a conductive sheet according to the present invention. In the method for manufacturing the conductive sheet exemplarily shown in FIG. 1, first, a mixture is prepared by mixing a dispersion liquid in which carbon nanotubes are dispersed in a dispersing agent and a dispersion liquid in which carbon black is dispersed in a solvent (mixing step). Next, carbon composite paste is prepared by separating the dispersing agent from the mixture obtained in the mixing step (separating step). Then, carbon composite filler is prepared by drying the carbon composite paste obtained in the separating step (drying step). Further, the carbon composite filler obtained in the drying step and a resin material are kneaded, then the conductive sheet is prepared by thermoforming (forming step).

Hereinafter, each step of the method for manufacturing the conductive sheet according to the present invention will be described in detail.

—Mixing Step—

Here, the mixing step of the present invention is described. In the mixing step of the present invention, a mixture is prepared by mixing a carbon nanotube dispersion liquid in which carbon nanotubes are dispersed in a dispersing agent and a carbon black dispersion liquid in which carbon black is dispersed in a solvent. More specifically, in the mixing step of the present invention, the mixture is prepared, which contains the carbon nanotubes and the carbon black at the ratio of 10-30 wt. %:90-70 wt. %.

The carbon nanotube dispersion liquid of the present invention is a dispersion liquid in which the carbon nanotubes are dispersed in a dispersing agent. Examples of methods for preparing the carbon nanotube dispersion liquid of the present invention include a method for preparing the carbon nanotube dispersion liquid by dispersing multi-walled carbon nanotubes with an aspect ratio of from 130 to 170 in an amount of 0.2 wt. % based on a water-soluble xylan solution at a concentration of 0.2%. In this case, after adding the multi-walled carbon nanotubes to the water-soluble xylan solution, the multi-walled carbon nanotubes can be stimulated and dispersed in the water-soluble xylan solution using, for example, an ultrasonic homogenizer. The multi-walled carbon nanotubes may be dispersed by an apparatus other than the ultrasonic homogenizer.

It is preferable that the multi-walled carbon nanotubes with the aspect ratio of from 130 to 170 are used as the carbon nanotubes of the present invention.

Here, the carbon nanotubes of the present invention are not particularly limited. Any of the multi-walled carbon nanotubes such as single-walled carbon nanotubes and double-walled carbon nanotubes may be used. The carbon nanotubes can be obtained, for example, by an arc discharge method, a laser vaporization method, a chemical vapor deposition and a hydrocarbon catalytic cracking method. If the carbon nanotubes have a large aspect ratio, it is difficult to unfasten entanglement of the bundled-shaped carbon nanotubes, which deteriorates dispersibility. The aspect ratio of the carbon nanotubes of the present invention is not particularly limited, however, preferably it is within, for example, the range of 100 to 50000.

The amount of the carbon nanotubes is set so as to meet the above-described weight ratio (10-30 wt. %) in the mixture.

The dispersing agent of the present invention is not particularly limited, provided that it is possible to maintain the dispersed state (uniformly dispersed state) of the carbon nanotubes in the carbon nanotube dispersion liquid. Preferably, the water-soluble xylan solution is used as such a dispersing agent. The expression here "uniformly dispersed" means that the carbon nanotubes are dispersed in the dispersing agent, with almost all (not less than 90%) of the bundles of the carbon nanotubes being unfastened.

The water-soluble xylan solution is obtained by dissolving water-soluble xylan in water (e.g., distilled water) at a predetermined concentration (e.g., 0.2%). It is preferable that the concentration of the water-soluble xylan solution is appropriately set according to the concentration (content ratio) and the like of the carbon nanotubes contained in the carbon nanotube dispersion liquid.

Here, the water-soluble xylan is a molecule containing 6 or more xylose residues that are linked by a 6-1, 4 bond, and 6 mg/mL or more thereof can be dissolved in water at 20° C. The water-soluble xylan is not a pure xylose polymer but a molecule in which at least part of hydroxyl groups of the xylose polymer are substituted by other substituents (for example, an acetyl group, a glucuronic acid residue, an arabinose residue and the like). Substituting a hydroxyl group of the xylan composed of only xylose residues with another substituent sometimes leads to a high water-solubility compared with that of the xylan composed of only xylose residues. The molecule in which the hydroxyl groups of the xylan consisting of only xylose residues are substituted by other substituents is, in other words, a molecule in which the substituents are bound to the xylose polymer or a modified xylose polymer. Note that the "modified" molecule means here a molecule modified compared with a reference molecule, which includes not only a molecule produced artificially but also a molecule that exists in nature. A molecule in which a 4-O-methylglucuronic acid residue and an acetyl group are bound to the xylose polymer is called "glucuronoxylan". A molecule in which an arabinose residue and a 4-O-methylglucuronic acid are bound to the xylose polymer is called "arabinoglucuronoxylan".

The carbon black dispersion liquid of the present invention is obtained by dispersing the carbon black in the solvent. Examples of methods for preparing the carbon black dispersion liquid of the present invention include a method for preparing the carbon black dispersion liquid by mixing and dispersing acetylene black in 10 times the amount of acetone. The treatment for dispersing the carbon black is not particularly limited, and it is possible, for example, to disperse the carbon black by a mixer and the like.

The carbon black can be obtained, for example, by a furnace process, a channel process, an acetylene process and a thermal process. As the carbon black of the present invention, it is preferable to use acetylene black manufactured by thermal decomposition of acetylene (acetylene process). It is also possible to use ketjen black as the carbon black. In place of the carbon black, carbon nanohorn, grapheme and the like may be used. As the carbon black, it is possible to use any of powder, a pressed product and a granular product. However, the pressed product is preferable for ease of treatment. The powder of the carbon black is pressed to form the pressed product of the carbon black, thus, it is possible to suppress scattering of the carbon black during working by using the pressed product of the carbon black.

It is preferable to use the carbon black having; the primary particle size of 20 to 50 nm; the specific surface area of 30 to 140 $m^2/g$; the bulk density of 0.04 to 0.25 g/mL; and the electrical resistivity of 0.1 to 30 Ω·cm. In particular, it is preferable to use the acetylene black having; the average particle size of 43 to 50 nm; the specific surface area of 34 to 44 $m^2/g$; the bulk density of 0.1 to 0.2 g/mL; and the electrical resistivity of 0.1 to 0.19 Ω·cm.

The amount of the carbon black is set so as to meet the above-described weight ratio (70-90 wt. %) in the mixture.

It is preferable to use the acetone having the concentration of 50% or more as the solvent of the present invention. In place of the acetone, another organic solvent (e.g., methyl ethyl ketone and toluene) may be used as the solvent.

In the mixing step of the present invention, the carbon nanotube dispersion liquid and the carbon black dispersion liquid prepared as described above are mixed and dispersed to prepare the mixture. The mixture prepared in the mixing step contains the carbon nanotubes and the carbon black at the ratio of 10-30 wt. %:90-70 wt. %. The treatment for dispersing the carbon nanotubes and the carbon black in the mixture is not particularly limited, and it is possible, for example, to disperse them by a mixer and the like. However, note that in this case, if they are treated by an ultrasonic homogenizer or a ball mill, structures of the carbon black are broken, which results in deterioration in the conductivity.

The carbon black dispersion liquid is prepared in the mixing step because if the carbon black is directly added to the carbon nanotube dispersion liquid, the carbon black floats on the surface of the carbon nanotube dispersion liquid and is hardly dispersed. For this reason, the carbon black dispersion liquid is prepared by dispersing the carbon black in the organic solvent such as acetone so as to be mixed with the carbon nanotube dispersion liquid.

—Separating Step—

Next, the separating step of the present invention is described. In the separating step of the present invention, the dispersing agent is separated from the mixture obtained in the mixing step so as to prepare carbon composite paste. If the dispersing agent remains in the resin product (conductive sheet) after forming, it may inhibit the conductivity in the resin product. For this reason, in the separating step, the dispersing agent is separated and removed from the mixture prepared in the mixing step.

Examples of methods for separating the dispersing agent in the present invention include filtration and centrifuge. In case of the filtration, the dispersing agent is separated from the mixture by a filter so that the carbon composite paste is prepared from a remaining material that remains on the filter. In this case, the solvent is also separated from the mixture together with the dispersing agent. When the water-soluble xylan solution is used as the dispersing agent, the filtration is performed using, for example, a filter having 0.8 μm bore diameter. When performing the filtration, it is preferable to rinse the remaining material with water (e.g. distilled water) and ethanol. That is, when performing the filtration using the filter, the remaining material is cleaned by the water and the ethanol. More specifically, the remaining material is rinsed alternately with the water and the ethanol, and finally rinsed with the ethanol. In place of the ethanol, it is possible to use another detergent such as isopropyl alcohol.

As the filter used for the filtration, a PTFE filter can be suitably used. Also, it is possible to use a paper filter, a glass fiber filter, a cellulose acetate filter, a cellulose acetate coat filter and the like. It is preferable to appropriately select the bore diameter of the filter according to the kind of the dispersing agent.

Figure 2:
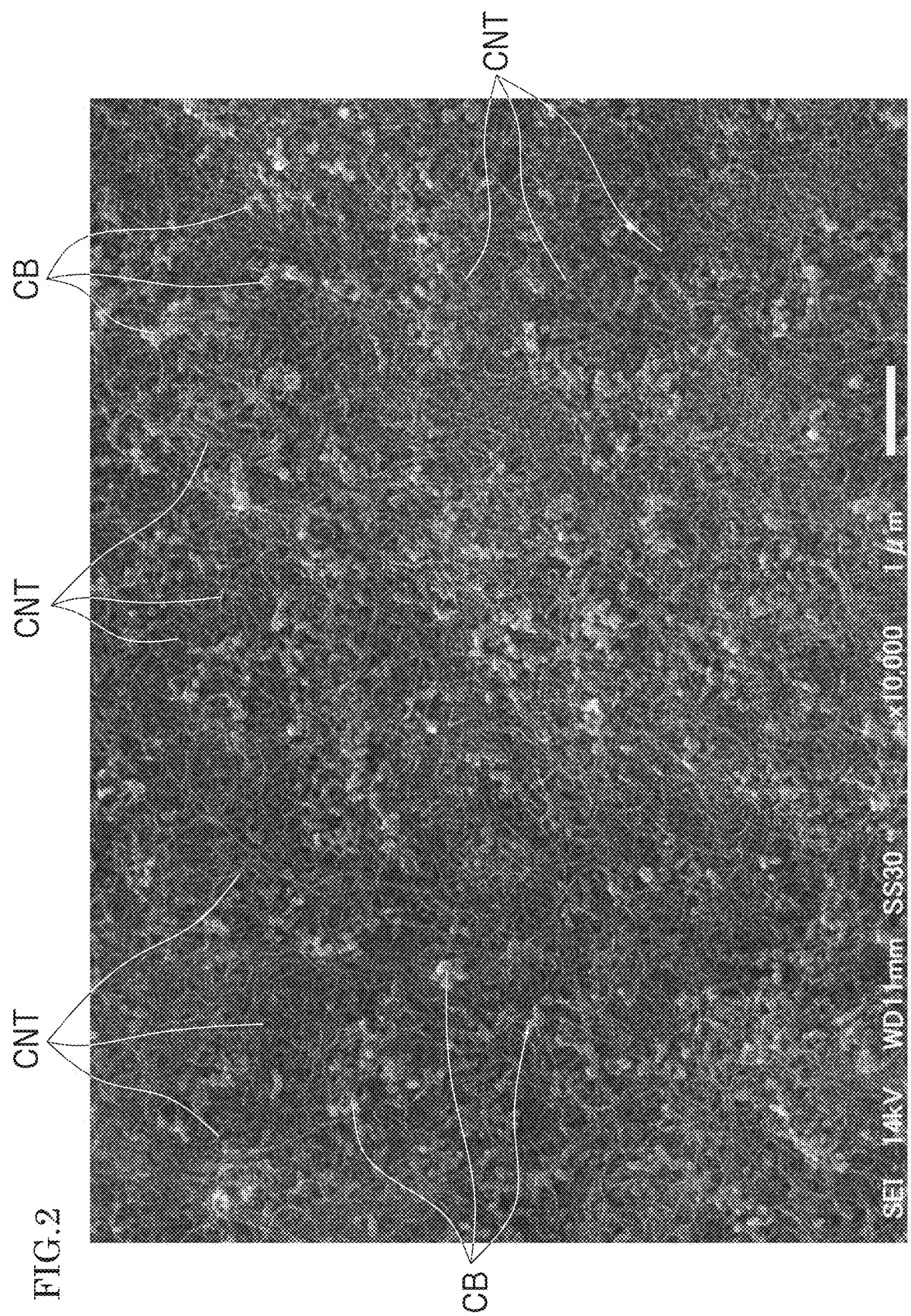
FIG. 2 is a SEM image (photograph) showing an example of a dispersed state of carbon nanotubes and carbon black in carbon composite paste.

The carbon composite paste is a paste-like composition obtained by removing the dispersing agent and the solvent from the mixture. In the carbon composite paste, the carbon nanotubes and the carbon black are dispersed. A state of the carbon composite paste obtained in the separating step, in which the carbon nanotubes and the carbon black are dispersed, is shown, for example, by a SEM image (photograph) in FIG. 2. In the example shown in FIG. 2, the carbon composite paste is dotted with structures of the carbon black (CB) each of which is formed by, for example, several to tens of units of carbon black joining each other. Many carbon nanotubes (CNT) each in a shape of a fine filament enter into the carbon black.

—Drying Step—

Subsequently, the drying step of the present invention is described. In the drying step of the present invention, the carbon composite paste obtained in the separating step is dried so as to prepare carbon composite filler. The carbon composite filler is obtained by removing the water and the detergent such as ethanol or isopropyl alcohol from the carbon composite paste so as to prevent curing inhibition of the resin material in the forming step. Since the carbon composite paste obtained in the separating step contains the water and the detergent, the water and the detergent are removed from the carbon composite paste in the drying step.

Examples of methods for removing the water in the present invention include a method for removing the water by drying. More specifically, the carbon composite paste is left at a normal temperature (room temperature) for 12 hours or more. After that, the carbon composite paste is dried at the temperature of 130° C. or more for 3 hours or more. When the carbon composite paste is already stored (kept) at the normal temperature for more than 12 hours, the above leaving treatment in the drying step may be omitted. Alternatively, it is possible to perform vacuum drying or freeze drying. It is also possible to perform the vacuum drying or the freeze drying along with the drying at the room temperature or the drying in the thermostatic chamber.

After the drying step, the carbon composite filler may be subjected to a pulverization treatment using, for example, a cutter mill or a counter jet mill, within a period that does not break the structures of the carbon black (for example, for 10 seconds or less). As the carbon composite filler in the dry state has a hardness that can be loosen with finger-pressure, the pulverization treatment may be performed using air flow caused by the rotation of the cutter and the like or collision of carbons with each other. It is preferable to avoid as much as possible the collision of the carbon black with a metal, a ceramic, a glass and the like and to perform the treatment for a short period. Also, the carbon composite filler that underwent the pulverization treatment may be subjected to a classification treatment using, for example, a sieve. The above pulverization treatment and classification treatment are performed so as to improve dispersibility of the carbon composite filler in the resin material in the forming step.

—Forming Step—

Next, the forming step in the present invention is described. In the forming step of the present invention, the carbon composite filler obtained by the drying step is kneaded with the resin material, and then a conductive sheet is prepared by thermoforming. More specifically, the conductive sheet that is formed in the forming step of the present invention is composed of the carbon composite filler in the amount of 10-50 wt. % and the resin material in the amount of 90-50 wt. %, and has the thickness of 1 mm or less. The thickness of the conductive sheet is not particularly limited provided that the conductive sheet has property of the surface resistance value as described later. However, it is preferable that the thickness is 0.1 to 10 mm (more preferably, 0.1 to 1 mm), and in addition, from the standpoint of electromagnetic shieldability of the conductive sheet, it is preferable that the thickness is 0.5 to 2 mm (more preferably, 0.5 to 1 mm).

From the standpoint of flame retardancy, heat resistivity and weatherability of the conductive sheet, it is preferable to use a silicone resin as the resin material of the present invention. As the silicone resin, a millable silicone resin is preferable, however, a liquid silicone resin may also be used. The resin material of the present invention is not particularly limited. It is possible to use various resins such as olefin resins including a polyethylen resin and a polypropylene resin, an oil-based urethane resin, an aqueous urethane resin, a polystyrene resin, an acrylic resin and a polyvinylchloride resin. In place of the resin material, it is also possible to use a natural rubber or a synthetic rubber.

It is possible to knead the carbon composite filler with the resin material using, for example, a mixer, a roll and a kneader. When kneading, it is preferable to add a curing agent, a heat resistant agent and a flame retardant. As the curing agent, it is possible to use, for example, an organic peroxide vulcanizing agent and an addition-type cross-linking agent. As the heat resistant agent and the flame retardant, it is possible to use, for example, a platinum compound, iron oxide, titanium oxide, cerium oxide, calcium oxide, phosphoric acid, cerium hydroxide, calcium hydroxide and silicon oxide. As the platinum compound, it is possible to use a publicly known platinum compound, in particular: a platinum simple substance; chloroplatinic acid; an alcohol compound, an aldehyde compound, an ether compound of the chloroplatinic acid; and complexes of the chloroplatinic acid with various olefins.

Examples of methods for forming the conductive sheet in the present invention include hot press forming, extrusion molding and injection molding, using molds.

—Characteristics—

The characteristics of the conductive sheet manufactured by the above-described manufacturing method are described.

A plurality of conductive sheets, each of which was composed of 25 wt. % carbon composite filler and 75 wt. % silicone resin and had the thickness of 1 mm, was prepared by changing the ratio (weight ratio) of the multi-walled carbon nanotubes (CNT) to the acetylene black (CB). Each surface resistance value (Ω/sq) was measured using a resistivity meter (Loresta EP, MCP-T360, manufactured by Mitsubishi Chemical Analytech Co., Ltd.) to obtain the measurement results as shown in FIG. 3. In FIG. 3, the carbon nanotubes are changed within the range of 0 to 50 wt. %, and the carbon black is changed within the range of 100 to 50 wt. %. As can be seen from FIG. 3, when the conductive sheet contains the carbon nanotubes and the carbon black at the ratio of 10-30 wt. %:90-70 wt. %, the surface resistance value changes within the range of 2.1 to 10 Ω/sq.

Figure 4:
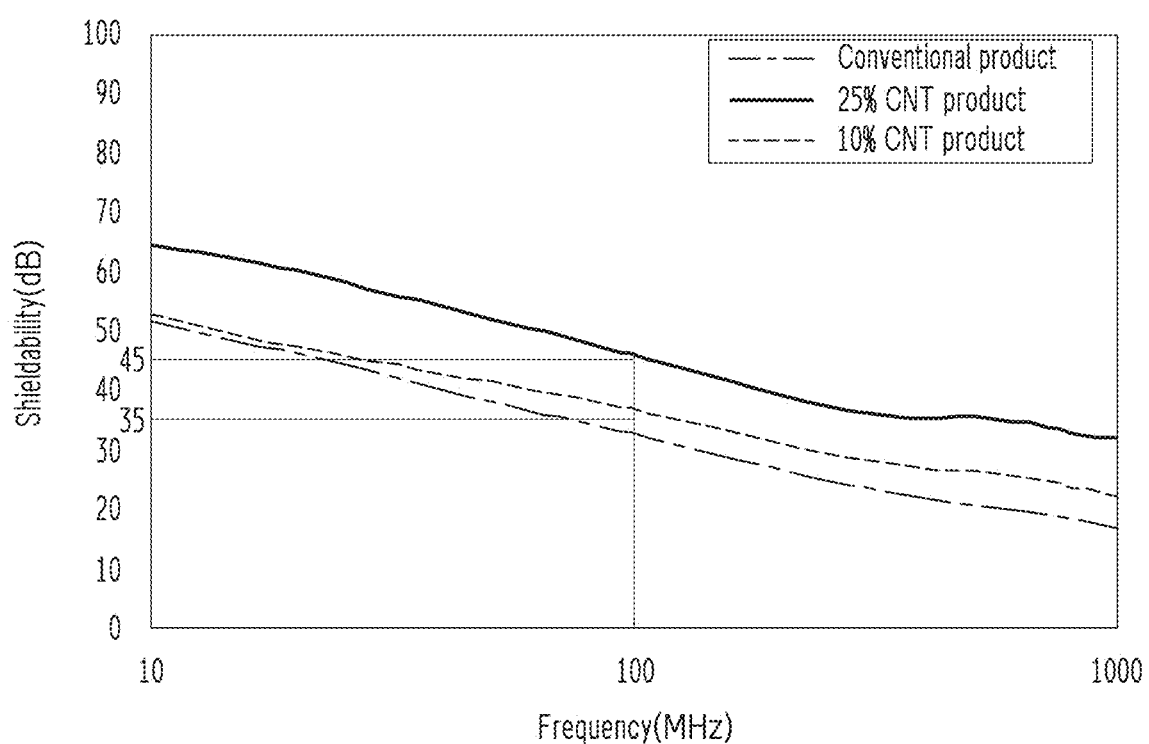
FIG. 4 is a graph showing an example of measurement results of electromagnetic shieldabilities of respective conductive sheets, using KEC method.

A plurality of conductive sheets, each of which was composed of 25 wt. % carbon composite filler and 75 wt. % silicone resin and had the thickness of 1 mm, was prepared by changing the ratio (weight ratio) of the multi-walled carbon nanotubes (CNT) to the acetylene black (CB). Each electromagnetic shieldability was measured by KEC method developed by KEC (KEC Electronic Industry Development Center, 3-2-2, Hikaridai, Seika-cho, Souraku-gun, Kyoto) in the frequency band of 10 to 1000 MHz using a spectrum analyzer (8591EM, manufactured by Hewlett-Packard Company), a signal generator (SMY01, manufactured by Rohde & Schwarz GmbH & Co. KG) and an amplifier (MLA-1K01-B01-27, manufactured by Techno Science Japan Co., Ltd.) to obtain the measurement results as shown in FIG. 4. In FIG. 4, the solid line shows the measurement results of the conductive sheet composed of 25 wt. % carbon nanotubes and 75 wt. % carbon black (hereinafter referred to as "25% CNT product"). The broken line shows the measurement results of the conductive sheet composed of 10 wt. % carbon nanotubes and 90 wt. % carbon black (hereinafter referred to as "10% CNT product"). The dashed-dotted line shows the measurement results of the conductive sheet composed of 0 wt. % carbon nanotubes and 100 wt. % carbon black (conventional product).

As can be seen from FIG. 4, the 25% CNT product has the electromagnetic shieldability of 45 dB or more at the frequency of 100 MHz. Also, the 25% CNT product has the electromagnetic shieldability of at least 30 dB in the frequency band of 10 to 1000 MHz, thus the electromagnetic shieldability is improved by approximately 15 dB compared with the conventional product.

As can be seen from FIG. 4, the 10% CNT product has the electromagnetic shieldability of 35 dB or more at the frequency of 100 MHz. Also, the 10% CNT product has the electromagnetic shieldability of at least 20 dB in the frequency band of 100 to 1000 MHz, thus the electromagnetic shieldability is improved by approximately 6 dB compared with the conventional product. As the ratio (weight ratio) of the carbon nanotubes contained in the conductive sheet increases, the electromagnetic shieldability is improved compared with the conventional product.

Figure 5:
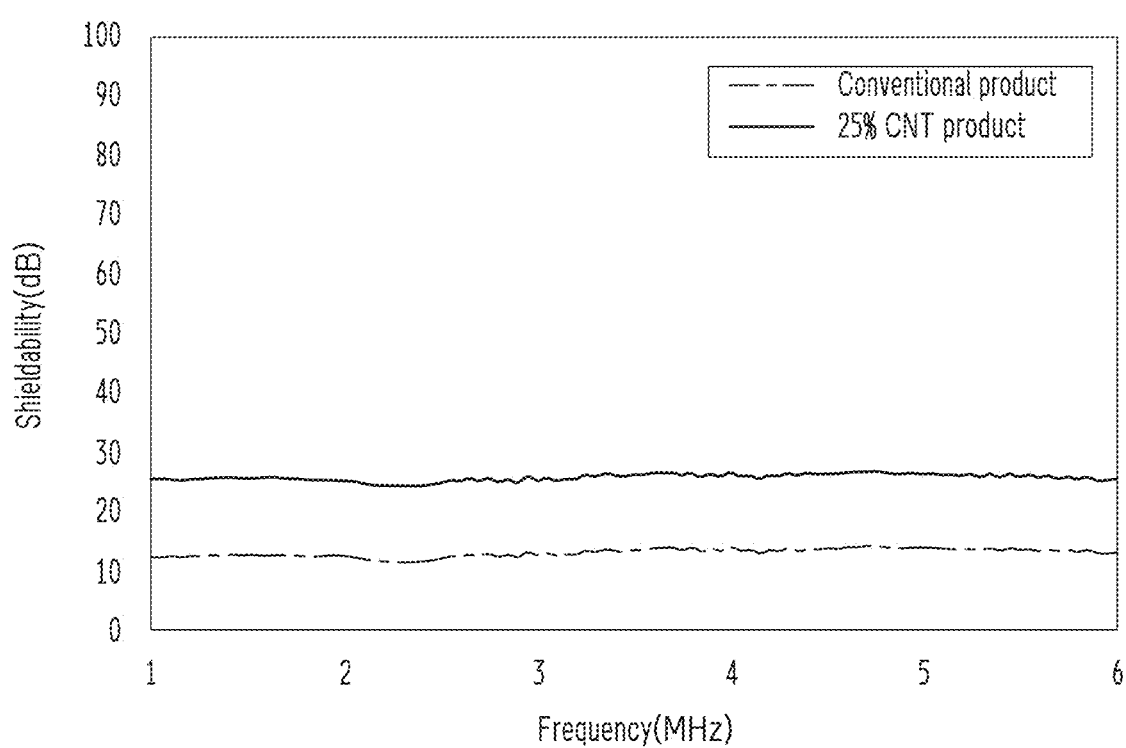
FIG. 5 is a graph showing an example of measurement results of electromagnetic shieldabilities of respective conductive sheets, using a coaxial tube method.

A plurality of conductive sheets, each of which was composed of 25 wt. % carbon composite filler and 75 wt. % silicone resin and had the thickness of 1 mm, was prepared by changing the ratio (weight ratio) of the multi-walled carbon nanotubes (CNT) to the acetylene black (CB). Each electromagnetic shieldability was measured by a coaxial tube method in the frequency band of 1 to 6 GHz to obtain the measurement results as shown in FIG. 5. Note that the above measurement of the electromagnetic shieldability was performed in KEC, using a modified coaxial tube method developed by KEC. In FIG. 5, the solid line shows the measurement results of the conductive sheet composed of 25 wt. % carbon nanotubes and 75 wt. % carbon black (25% CNT product). The dashed-dotted line shows the measurement results of the conductive sheet composed of 0 wt. % carbon nanotubes and 100 wt. % carbon black (conventional product).

As can be seen from FIG. 5, the 25% CNT product has the electromagnetic shieldability of at least 20 dB in the frequency band of 1 to 6 GHz, thus the electromagnetic shieldability of the 25% CNT product in the frequency band of 1 to 6 GHz is improved by approximately 10 dB compared with the conventional product. As the ratio (weight ratio) of the carbon nanotubes contained in the conductive sheet increases, the electromagnetic shieldability is improved compared with the conventional product. Conversely, as the ratio (weight ratio) of the multi-walled carbon nanotubes contained in the conductive sheet decreases, the electromagnetic shieldability comes closer to that of the conventional product. However, even the 10% CNT product certainly has the electromagnetic shieldability of at least 20 dB.

—Effects—

The method for manufacturing the conductive sheet of the present invention provides effects as described below.

Since the mixture is prepared by mixing the carbon nanotube dispersion liquid and the carbon black dispersion liquid both previously prepared, it is possible to prepare the carbon composite paste, the carbon composite filler and the conductive sheet, in which the carbon nanotubes and the carbon black are dispersed uniformly. Thus, as the carbon nanotubes enter into the carbon black dispersed in the resin material, it is possible to suppress reaggregation of the carbon nanotubes. Then, the carbon nanotubes that enter into the carbon black form conductive paths. Therefore, the method for manufacturing the conductive sheet according to the present invention can provide the conductive sheet excellent in conductivity.

Also, since the mixture containing the carbon nanotubes and the carbon black at the ratio of 10-30 wt. %:90-70 wt. % is prepared in the mixing step, the concentration of the carbon black can be reduced so that it is equal to or lower than the concentration in the case in which only the carbon black is used as the conductive material. Thus, it is possible to suppress deterioration in strength of the conductive sheet, which is caused by the carbon black excessively added.

Furthermore, since the multi-walled carbon nanotubes with the aspect ratio of from 130 to 170 are used as the carbon nanotubes, it is possible to easily form the conductive paths by the carbon nanotubes in the resin material. Thus, the conductivity of the conductive sheet can be improved. Since the water-soluble xylan solution is used as the dispersing agent, auto-aggregation of the carbon nanotubes can be effectively prevented when preparing the carbon nanotube dispersion liquid. Thus, the carbon nanotubes can be dispersed uniformly in the water-soluble xylan solution. Since the silicone resin is used as the resin material, it is possible to provide the conductive sheet excellent in weatherability and heat resistivity.

Also, since the water-soluble xylan solution is separated from the mixture by filtration in the separating step, it is possible to prevent the dispersing agent (water-soluble xylan solution) that may inhibit the conductivity from remaining in the conductive sheet. Thus, the conductivity of the conductive sheet can be improved. Furthermore, since the remaining material is rinsed with the water, and the ethanol or the isopropyl alcohol when filtrating, the dispersing agent (water-soluble xylan solution) and the solvent (acetone and the like) can be effectively removed. Thus, it is possible to prevent the dispersing agent and the solvent from remaining in the conductive sheet, which results in improved conductivity of the conductive sheet. Removing the solvent can also prevent chemicals harmful to humans from volatilizing in the drying step.

Since the drying is performed at the temperature of 130° C. or more for 3 hours or more in the drying step, the water and the solvent (acetone and the like) are removed from the carbon composite paste. Thus, when preparing the conductive sheet in the forming step, it is possible to suppress curing inhibition of the resin material.

Since the curing agent, the heat resistant agent and the flame retardant are added when kneading the carbon composite filler with the resin material in the forming step, it is possible to provide the conductive sheet excellent in heat resistivity and flame retardancy.

Here, freeze-drying may be considered as the water drying step other than the above-described separating step and drying step. However, if the freeze-drying is performed, there may be a problem that the dispersing agent remains in the carbon composite filler, which may results in deterioration in conductivity of the resin product due to the dispersing agent, as described above. Also, the carbon composite filler adheres in a state of a sheet because of bonding function of the dispersing agent, which leads to difficulty in dispersion in the resin material. It may be possible to perform carbonization in which the dispersing agent is burnt at the high temperature of 300° C. or more. However, in this carbonization, the carbon composite filler after the high-temperature treatment becomes a hard mass. Therefore, when dispersing it in the resin material, it is necessary to pulverize the mass by adding strong force using a hard substance, specifically, by a mortar, a ball mill or the like. However, when thus pulverizing the carbon composite filler after the high-temperature treatment, the structures of the carbon black are broken, which results in deterioration in conductivity of the conductive sheet.

In order to confirm the deterioration in conductivity of the conductive sheet due to destruction of the structures of the carbon black, an experiment was conducted as described below. That is, carbon composite filler composed of 10 wt. % carbon nanotubes and 90 wt. % carbon black was pulverized for approximately 30 minutes by a mortar so as to form a conductive sheet containing the filler at a concentration of 25% (composed of 25 wt. % carbon composite filler and 75 wt. % silicone resin) and having the thickness of 1 mm. Then, the surface resistance value of the above conductive sheet was measured. Such an experiment (i.e., forming the conductive sheet and measuring the surface resistance value) was conducted several times, and it was found that the surface resistance value of the conductive sheet fell within the range of 900 to 3100 Ω/sq, accordingly, the conductivity of the conductive sheet was deteriorated.

On the other hand, in the present invention, not only the water but also the dispersing agent and the solvent can be removed effectively in the above-described separating step and the drying step. Furthermore, the drying step can maintain the structures of the carbon black, not breaking them as much as possible. Thus, the dispersion state of the carbon nanotubes and the carbon black can be maintained in the dried carbon composite filler. As a result, it is possible to prevent deterioration in conductivity of the conductive sheet due to destruction of the structures of the carbon black.

[Conductive Sheet]

Next, the conductive sheet according to the present invention is described.

The conductive sheet according to the present invention includes the carbon nanotubes and the carbon black as the conductive materials, which are dispersed in the resin material. The carbon composite filler, which is composed of the carbon nanotubes in the amount of 10 to 30 wt. % and the carbon black in the amount of 90 to 70 wt. %, is dispersed in the resin material uniformly. The conductive sheet is composed of the carbon composite filler in the amount of 10 to 50 wt. % and the resin material in the amount of 90 to 50 wt. %. The surface resistance value of the conductive sheet is from 1 to 10 Ω/sq. More specifically, the conductive sheet according to the present invention preferably has the thickness of 1 mm or less and the surface resistance value of 1 to 10 Ω/sq. The thickness of the conductive sheet is not particularly limited provided that the surface resistance value of the conductive sheet falls within the above range (1 to 10 Ω/sq). However, it is preferable that the thickness is 0.1 to 10 mm (more preferably, 0.5 to 2 mm).

The conductive sheet according to the present invention is manufactured by performing the above-described method for manufacturing the conductive sheet. The carbon nanotubes, the carbon black and the resin material are the same as those described above in the method for manufacturing the conductive sheet.

Examples of the characteristics of the conductive sheet according to the present invention include the characteristics as described below.

(1) Electromagnetic shieldability of 35 dB or more at the frequency of 100 MHz measured by KEC method; (2) Electromagnetic shieldability of at least 20 dB in the frequency band of 1 to 3 GHz (more preferably, 1 to 6 GHz) measured by the coaxial tube method; (3) Durometer hardness of A40 to A75; (4) Flame retardancy of V-1 or more under UL 94 test conditions; (5) Tensile strength of 6.5 to 20 Mpa; (6) Elongation rate of 120 to 300%; and (7) Tear strength of 10 to 40 N/mm.

Hereinabove, the description was given on the case where the carbon nanotubes and the carbon black were included in the resin material. However, it is possible to add carbon fiber, grapheme and the like as conductive materials to be contained in the resin material.

—Effects—

The conductive sheet according to the present invention provides effects as described below.

Since the carbon composite filler, in which the carbon nanotubes and the carbon black are dispersed, is dispersed uniformly in the resin material, it is possible to suppress reaggregation of the carbon nanotubes. Specifically, since the carbon nanotubes enter into the carbon black dispersed in the resin material, the reaggregation of the carbon nanotubes is suppressed. Then, the carbon nanotubes that enter into the carbon black form conductive paths. Therefore, it is possible to provide the conductive sheet excellent in conductivity, which has the thickness of 1 mm or less and the surface resistance value of 1 to 10 Ω/sq. Also, the concentration of the carbon black can be reduced so that it is equal to or lower than the concentration in the case in which only the carbon black is used as the conductive material. Thus, it is possible to suppress deterioration in strength of the conductive sheet, which is caused by the carbon black excessively added.

The carbon composite filler is obtained by the steps: preparing the mixture by mixing the dispersion liquid in which the carbon nanotubes are dispersed in the dispersing agent and the dispersion liquid in which the carbon black is dispersed in the solvent; separating the dispersing agent from the mixture so as to prepare the carbon composite paste; and drying the obtained carbon composite paste. Since the water and the solvent have been removed from the dried carbon composite filler prepared as described above, when preparing the conductive sheet using the dried carbon composite filler, it is possible to prevent curing inhibition of the resin material that is caused by the water and the solvent entering into the resin material.

Furthermore, since the multi-walled carbon nanotubes with the aspect ratio of from 130 to 170 are used as the carbon nanotubes, it is possible to easily form the conductive paths by the carbon nanotubes in the resin material. Thus, the conductivity of the conductive sheet can be improved. Since the water-soluble xylan solution is used as the dispersing agent, auto-aggregation of the carbon nanotubes can be effectively prevented when preparing the carbon nanotube dispersion liquid. Thus, the carbon nanotubes can be dispersed uniformly in the water-soluble xylan solution. Since the silicone resin is used as the resin material, it is possible to provide the conductive sheet excellent in weatherability and heat resistivity.

Also, the electromagnetic shieldability measured by KEC method is 35 dB or more at the frequency of 100 MHz, thus it is possible to provide the conductive sheet excellent in electromagnetic shieldability. In the example shown in FIG. 4, the electromagnetic shieldability at the frequency of 100 MHz is improved by approximately 6 to 15 dB compared with the conventional product. The electromagnetic shieldability measured by the coaxial tube method is at least 20 dB in the frequency band of 1 to 3 GHz (more preferably, 1 to 6 GHz), thus it is possible to provide the conductive sheet excellent in electromagnetic shieldability. In the example shown in FIG. 5, the electromagnetic shieldability of the 25% CNT product in the frequency band of 1 to 6 GHz is improved by approximately 10 dB compared with the conventional product. Also, it is possible to provide the conductive sheet having the durometer hardness of A40 to A75, which is flexible and easily transformed, and is excellent in tensile strength and tear strength. Also, it is possible to provide the conductive sheet having the flame retardancy of V-1 or more under UL 94 test conditions, which is excellent in flame retardancy.

[Carbon Composite Paste]

Next, the carbon composite paste according to the present invention is described.

The carbon composite paste according to the present invention includes the carbon nanotubes and the carbon black as the conductive materials. The carbon composite paste is prepared by the steps of; preparing the mixture containing the carbon nanotubes and the carbon black at the ratio of 10 to 30 wt. %:90 to 70 wt. %, by mixing the carbon nanotubes dispersed in the water-soluble xylan solution and the carbon black dispersed in the acetone; and separating the water-soluble xylan solution and the acetone from the mixture by filtration.

The carbon composite paste according to the present invention is manufactured by performing the mixing step and the separating step of the above-described method for manufacturing the conductive sheet. The carbon nanotubes and the carbon black are the same as those described above in the method for manufacturing the conductive sheet.

The carbon composite paste can be used as is after being manufactured in the separating step. Alternatively, the carbon composite paste after being manufactured in the separating step may be left at the normal temperature (room temperature) so that part of the water is removed before the use.

—Effects—

The carbon composite paste according to the present invention provides effects as described below.

Since the mixture is prepared by mixing the carbon nanotube dispersion liquid and the carbon black dispersion liquid both previously prepared, it is possible to easily obtain the carbon composite paste in which the carbon nanotubes and the carbon black are dispersed uniformly. Since the carbon composite paste of the present invention can suppress scattering of the carbon, it is easy to treat and can be used for various purposes. For example, it can be suitably used as an experimental material and the like. Also, the carbon composite paste of the present invention can be subjected to the drying step of the method for manufacturing the conductive sheet as describe above so that the carbon composite filler is prepared.

[Carbon Composite Filler]

Next, the carbon composite filler according to the present invention is described.

The carbon composite filler according to the present invention can be obtained by drying the carbon composite paste according to the present invention as described above. For example, the carbon composite paste is left at the normal temperature for 12 hours or more, then is dried at the temperature of 130° C. or more for 3 hours or more. Thus, the carbon composite filler can be prepared.

The carbon composite filler according to the present invention is manufactured by performing the mixing step, the separating step and the drying step of the above-described method for manufacturing the conductive sheet. The carbon nanotubes and the carbon black are the same as those described above in the method for manufacturing the conductive sheet.

—Effects—

The carbon composite filler according to the present invention provides effects as described below.

Since the mixture is prepared by mixing the carbon nanotube dispersion liquid and the carbon black dispersion liquid both previously prepared, it is possible to easily obtain the carbon composite filler in which the carbon nanotubes and the carbon black are dispersed uniformly. Since the drying is performed at the temperature of 130° C. or more for 3 hours or more, the water and the solvent (acetone and the like) are removed, thus, it is possible to suppress curing inhibition of the resin material in the resin product such as the conductive sheet. The carbon composite filler of the present invention is easy to treat, and it can be used for various purposes. For example, it can be suitably used as an electrode material for a battery, a transparent film material, a conductive rubber material and the like. Also, the carbon composite filler of the present invention can be subjected to the forming step of the method for manufacturing the conductive sheet as described above so that the conductive sheet is prepared. The conductive sheet prepared from the carbon composite filler of the present invention can be used as an anti-static sheet, a contact material and the like. Furthermore, by adding the carbon composite filler of the present invention to the resin material, it is possible to prepare packings having both waterproof property and electromagnetic shieldability, and packings for the inside of an engine room and the like, which has both heat resistivity and electromagnetic shieldability. By adding the carbon composite filler of the present invention to synthetic rubber, it is possible to prepare a tire and the like to which conductivity is given.

[Conductive Resin Material and Conductive Rubber Material]

Next, the conductive resin material and the conductive rubber material according to the present invention are described.

The conductive resin material according to the present invention is composed of the above carbon composite filler obtained by drying the carbon composite paste according to the present invention in the amount of 10-50 wt. % and the resin material in the amount of 90-50 wt. %. As described above, from the standpoint of flame retardancy, heat resistivity and weatherability, it is preferable to use a silicone resin as the resin material. As the silicone resin, a millable silicone resin is preferable, however, a liquid silicone resin may also be used. The resin material is not limited to the silicone resin. As the resin material, it is possible to use, for example, olefin resins including a polyethylene resin and a polypropylene resin, an oil-based urethane resin, an aqueous urethane resin, a polystyrene resin, an acrylic resin and a polyvinylchloride resin.

The conductive resin material according to the present invention is manufactured by: performing the mixing step and the separating step of the above-described method for manufacturing the conductive sheet; and kneading the carbon composite filler obtained by drying the carbon composite paste prepared by the separating step with the resin material. When kneading, the curing agent, the heat resistant agent and the flame retardant may be added, as described above. For drying the carbon composite paste, it may be left at the normal temperature (room temperature) for 12 hours or more, and then dried at the temperature of 130° C. or more for 3 hours or more. The carbon composite paste may also be dried by another method. The conductive sheet according to the present invention as described above can be obtained by forming the conductive resin material according to the present invention using the forming method as described above (e.g., hot press forming, extrusion molding and injection molding, using molds).

The conductive rubber material according to the present invention is composed of the above-described carbon composite filler obtained by drying the carbon composite paste according to the present invention in the amount of 10-50 wt. % and a rubber material in the amount of 90-50 wt. %. As the rubber material, natural rubber or synthetic rubber may be used.

The conductive rubber material according to the present invention is manufactured by: performing the mixing step and the separating step of the above-described method for manufacturing the conductive sheet; and kneading the carbon composite filler obtained by drying the carbon composite paste prepared by the separating step with the rubber material. When kneading, the curing agent, the heat resistant agent and the flame retardant may be added, as described above. As described above, for drying the carbon composite paste, it may be left at the normal temperature (room temperature) for 12 hours or more, and then dried at the temperature of 130° C. or more for 3 hours or more. The carbon composite paste may also be dried by another method.

—Effects—

For obtaining the conductive resin material and the conductive rubber material according to the present invention, the mixture is prepared by mixing the carbon nanotube dispersion liquid and the carbon black dispersion liquid both previously prepared, thus it is possible to easily obtain the conductive resin material and the conductive rubber material in which the carbon nanotubes and the carbon black are dispersed uniformly. Other than the above-described conductive sheet and the packings, the conductive resin material according to the present invention can be used for various purposes such as a shielding resin case, an antistatic box, a conductive resin case, antistatic fiber, conductive adhesive, shield hose, a conductive wiring ground material, a shield wiring duct and conductive carrier tape. Also, other than the above-described tire, the conductive rubber material according to the present invention can be used for various purposes such as an electrical contact, a conductive roll, a transport belt, a floor material, a mat, footwear, gloves, an apron and a heater.

This application claims priority on Patent Application No. 2013-228041 filed in Japan on Nov. 1, 2013, the entire contents of which are herein incorporated by reference.

INDUSTRIAL APPLICABILITY

The present invention is applicable to a conductive sheet, a method for manufacturing the same, carbon composite paste, carbon composite filler, a conductive resin material and a conductive rubber material. The present invention is suitable for improving conductivity by suppressing reaggregation of carbon nanotubes.

The invention claimed is:

1. A conductive sheet comprising:
   carbon composite filler being dried carbon composite filler paste composed of carbon nanotubes in an amount of 10 to 30 wt. % and carbon black in an amount of 90 to 70 wt. % as conductive materials such that the carbon black and the carbon nanotubes are uniformly dispersed in the carbon composite filler, and
   a resin material in which the carbon composite filler is uniformly dispersed,
   wherein the conductive sheet is composed of the carbon composite filler in an amount of 10 to 50 wt. % and the resin material in an amount of 90 to 50 wt. %, and
   wherein the carbon nanotubes comprise multi-walled carbon nanotubes having an aspect ratio of from 130 to 170 such that a surface resistance value of the conductive sheet is from 1 to 10 Ω/sq.

2. The conductive sheet according to claim 1, wherein the conductive sheet has a thickness of 1 mm or less.

3. The conductive sheet according to claim 1,
   wherein the carbon composite filler is prepared by the steps of: preparing a mixture by mixing a dispersion liquid in which the carbon nanotubes are dispersed in a dispersing agent and a dispersion liquid in which the carbon black is dispersed in a solvent; and drying a carbon composite paste obtained by separating the dispersing agent from the mixture.

4. The conductive sheet according to claim 3,
wherein the carbon black is acetylene black,
wherein the dispersing agent is a water-soluble xylan solution, and
wherein the solvent is acetone.

5. The conductive sheet according to claim 1, wherein an electromagnetic shieldability measured by KEC method is 35 dB or more at a frequency of 100 MHz.

6. The conductive sheet according to claim 1, wherein an electromagnetic shieldability measured by a coaxial tube method is at least 20 dB in a frequency band of 1 to 3 GHz.

7. The conductive sheet according to claim 1, wherein a durometer hardness is from A40 to A75.

8. The conductive sheet according to claim 1,
wherein at least one of a platinum compound, iron oxide, titanium oxide, cerium oxide, calcium oxide, phosphoric acid, cerium hydroxide, calcium hydroxide and silicon oxide is added to the conductive sheet as a flame retardant, and
wherein the conductive sheet has a flame retardancy of V-1 or more under UL 94 test conditions.

9. The conductive sheet according to claim 1, wherein the conductive sheet comprises a thickness of 0.1 to 10 mm.

10. The conductive sheet according to claim 1, wherein the conductive sheet comprises a thickness of 0.5 to 2 mm.

11. The conductive sheet according to claim 1, wherein
the carbon composite filler, which is composed of the carbon nanotubes in an amount of 15 to 30 wt. % and the carbon black in an amount of 85 to 70 wt. %, is dispersed uniformly in the resin material, and
the surface resistance value of the conductive sheet is from 2.1 to 8.0 $\Omega$/sq.

12. The conductive sheet according to claim 1, wherein
the carbon composite filler, which is composed of the carbon nanotubes in an amount of 20 to 30 wt. % and the carbon black in an amount of 80 to 70 wt. %, is dispersed uniformly in the resin material, and
the surface resistance value of the conductive sheet is from 2.1 to 6.5 $\Omega$/sq.

13. The conductive sheet according to claim 1, wherein
the carbon composite filler, which is composed of the carbon nanotubes in an amount of 25 to 30 wt. % and the carbon black in an amount of 75 to 70 wt. %, is dispersed uniformly in the resin material, and
the surface resistance value of the conductive sheet is from 2.1 to 3.9 $\Omega$/sq.

14. The conductive sheet according to claim 1, wherein the carbon black comprises a primary particle size of 20 to 50 nm; a specific surface area of 30 to 140 $m^2$/g; a bulk density of 0.04 to 0.25 g/mL; and an electrical resistivity of 0.1 to 30 $\Omega$cm.

15. The conductive sheet according to claim 1, wherein the carbon black comprises an acetylene black comprising: an average particle size of 43 to 50 nm; a specific surface area of 34 to 44 $m^2$/g; a bulk density of 0.1 to 0.2 g/mL; and an electrical resistivity of 0.1 to 0.19 $\Omega$cm.

16. The conductive sheet according to claim 1, wherein the carbon composite filler is uniformly dispersed in the resin material such that not less than 90% of bundles of the carbon nanotubes are unfastened.

17. A conductive sheet comprising:
carbon composite filler being dried carbon composite filler paste composed of carbon nanotubes in an amount of 10 to 30 wt. % and carbon black in an amount of 90 to 70 wt. % as conductive materials such that the carbon black and the carbon nanotubes are uniformly dispersed in the carbon composite filler; and
a resin material in which the carbon composite filler is uniformly dispersed,
wherein the conductive sheet is composed of the carbon composite filler in an amount of 10 to 50 wt. % and the resin material in an amount of 90 to 50 wt. %,
wherein a surface resistance value of the conductive sheet is from 1 to 10 $\Omega$/sq,
wherein the conductive sheet has a thickness of 0.1 to 10 mm,
wherein an electromagnetic shieldability of the conductive sheet measured by KEC method is 35 dB or more at a frequency of 100 MHz, and
wherein the conductive sheet has an elongation rate of 120 to 300% and is transformable.

18. The conductive sheet according to claim 17, wherein the conductive sheet has a durometer hardness of A 40 to A 75.

19. The conductive sheet according to claim 17, wherein the conductive sheet has a tensile strength of 6.5 to 20 Mpa.

20. The conductive sheet according to claim 17, wherein the conductive sheet has a tear strength of 10 to 40 N/mm.

21. The conductive sheet according to claim 17, wherein the resin material is a millable silicone resin.

* * * * *